United States Patent

Su et al.

Patent Number: 6,061,292
Date of Patent: May 9, 2000

[54] METHOD AND CIRCUIT FOR TRIGGERING COLUMN SELECT LINE FOR WRITE OPERATIONS

[75] Inventors: Teng Su, Sunnyvale; Hua Zheng, Fremont; Kamin Fei, Sunnyvale, all of Calif.

[73] Assignee: Winbond Electronics Corporation, Hsin-Chu, Taiwan

[21] Appl. No.: 09/195,268

[22] Filed: Nov. 18, 1998

Related U.S. Application Data

[60] Provisional application No. 60/097,437, Aug. 21, 1998.

[51] Int. Cl.[7] ............................................ G11C 8/00
[52] U.S. Cl. ................................ 365/230.06; 365/189.05
[58] Field of Search ........................ 365/230.06, 189.05, 365/233, 230.02, 189.01

[56] References Cited

U.S. PATENT DOCUMENTS 5,754,481  5/1998  Yabe et al. ........................ 365/189.05
5,848,014  12/1998 Yukshing ............................. 365/227
5,923,613  7/1999  Tien et al. .......................... 365/233

*Primary Examiner*—David Nelms
*Assistant Examiner*—David Lam
*Attorney, Agent, or Firm*—Townsend & Townsend & Crew LLP

[57] ABSTRACT

Methods and circuits for triggering column select line for write operations in a multiple data rate (e.g., a double data rate) operation. A memory device includes a memory array that stores data values, an address logic circuit that generates an address for the memory array, and a column decoder. The column decoder couples to the address logic circuit and the memory array. The column decoder receives either a data strobe input signal (DQS) or a clock signal (CLK), or both, and activates a column select line for the memory array in response to one of the input signal(s).

30 Claims, 3 Drawing Sheets

METHOD AND CIRCUIT FOR TRIGGERING COLUMN SELECT LINE FOR WRITE OPERATIONS

This application claims the benefit of U.S. provisional application Ser. No. 60/097,437, filed Aug. 21, 1998, which is incorporated herein by reference. This application is further related to U.S. patent application Ser. No. 09/195,269, entitled "MEMORY ARRAY ARCHITECTURE FOR MULTI-DATA RATE OPERATION," and U.S. patent application Ser. No. 09/195,743, entitled "METHOD AND CIRCUIT FOR ACCESSING DATA BITS IN A MEMORY ARRAY IN MULTI-DATA RATE OPERATION," both are filed on the same day as the present application, assigned to the assignee of the present invention, and incorporated herein by reference.

BACKGROUND OF THE INVENTION

The present invention relates generally to memory devices, and more particularly to method and circuit for trigger column select line for write operations.

Memory devices are integral to a computer system, and to many electronic circuits. Constant improvements in the operating speed and computing power of a central processing unit (CPU) enables operation of an ever-greater variety of applications, many of which require faster and larger memories. Larger memories can be obtained by shrinking the geometry of the memory cells and data lines within memory devices. However, with regard to memory speed, the access time for a memory device is generally governed by certain limitations. More particularly, memory speed is, to a large extent, dictated by the charge and discharge rates of parasitic capacitance on memory data lines.

Conventionally, a memory access to write a data bit is performed by: (1) activating a row control line for the required memory location; (2) receiving a write command and the associated data bit; (3) activating a column select line; and (4) providing the data bit to the memory cell. Conventionally, these steps are performed in sequential order for each data bit being stored. Furthermore, memory operations are typically performed on one data bit per clock cycle. This is generally referred to as a single data rate (SDR) operation. Also, for a write operation, the write command and the associated data bit are typically received concurrently.

The process described above typically defines the access time of a memory device (i.e., to write a data bit to memory). The access time determines the maximum data transfer rate for a memory device. Traditionally, improvement in the access time of a memory write is limited, in part, to the time it takes to charge the sense line. Incremental improvements can be made to decrease the charge time by reducing the geometry of the device, thereby reducing the parasitic effects.

Large improvement in the data storage rate can be achieved by performing a (substantially) concurrent loading of two data bits to memory. This is generally referred to as a "prefetch" operation. The prefetch operation facilitates a double data rate (DDR) operation wherein two data bits are provided to memory in one clock cycle (i.e., on both the rising and falling edges of a clock signal). A DDR write is achieved by (serially) receiving two data bits, usually from one device input/output (I/O) pin, aligning the data bits, and performing a (concurrent) double write to memory.

In a DDR write operation, unlike a SDR write operation, the write command and the associated data bits are typically not received concurrently. For example, the input data bits may be received one or more clock cycles after the write command is received. Furthermore, the data and write command may not be referenced to a common (e.g., clock) signal. For example, the write command and the address signals for a DDR write may be referenced to the rising edge of the clock signal (i.e., similar to a SDR write operation) but the data may be referenced to a data strobe input signal (DQS). Therefore, techniques are needed to properly activate (or trigger or select) the column select line for write operations in a DDR or multi-data rate operation.

SUMMARY OF THE INVENTION

The present invention provides methods and circuits for triggering a column select line for memory writes in a multi-data rate operation. In a single data rate (SDR) operation, the input data is typically aligned to a clock signal (CLK). However, for multi-data rate operation such as, for example, a double data rate (DDR) operation in accordance with JEDEC standards, the input data bits are aligned to a data strobe input signal (DQS). In this case, the column select line for write operations can be triggered based on the DQS signal. The column select line for write operations can also be triggered based on appropriate edges of the CLK signal, and possibly further delayed, to ensure that an adequate time period is provided to account for uncertainly in the arrival of the input data bits.

A specific embodiment of the invention provides a memory device that performs write to memory at a multi-data rate. The memory device includes a memory array that stores data value, an address logic circuit that generates an address for the memory array, and a column decoder. The column decoder couples to the address logic circuit and the memory array. The column decoder receives either a data strobe input signal (DQS) or a clock signal (CLK), or both, and activates (or triggers or selects) a column select line in the memory array in response to the input signal(s).

Another specific embodiment of the invention provides a method for performing a write of data bits to a memory array. A data strobe input signal (DQS) or a clock signal (CLK), or both, is received, along with the input data bits. Based on the DQS signal or the CLK signal, a column select line in the memory array is activated, or triggered. The column select line facilitates the write of data bits to the memory array.

The foregoing, together with other aspects of this invention, will become more apparent when referring to the following specification, claims, and accompanying drawings.

DESCRIPTION OF THE SPECIFIC EMBODIMENTS

Figure 1A:
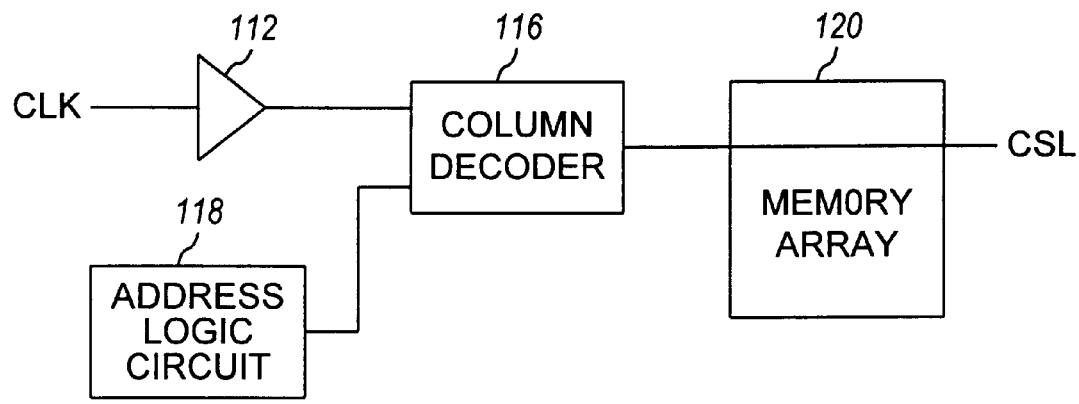
FIG. 1A shows a block diagram of an embodiment of a circuit that activates a column select line (CSL)

FIG. 1A shows a block diagram of an embodiment of a circuit that activates a column select line (CSL). In one implementation, the column select line for read and write operations is triggered from an edge (e.g., a rising edge) of a clock signal (CLK). As shown in FIG. 1A, the clock signal (CLK) is provided to a buffer 112 and further to a column decoder 116 that also receives a memory address from an address logic circuit 118. Column decoder 116 activates (or selects) a column select line in a memory array 120 based on the memory address. Memory array 120 can be implemented within a dynamic random access memory (DRAM), a synchronous DRAM (SDRAM), a synchronous graphics RAM (SGRAM), or other types of memory devices.

Figure 1B:
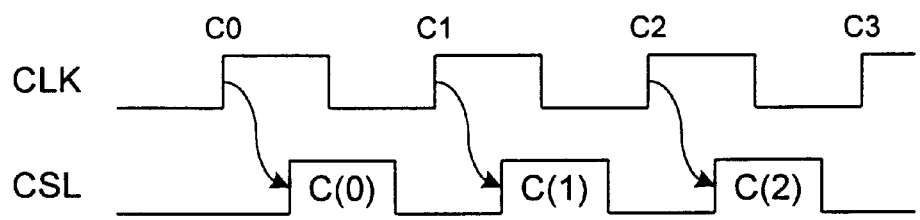
FIGS. 1B and 1C show timing diagrams of the CSL corresponding to the embodiment shown in FIG. 1A.

FIG. 1B shows a timing diagram of the CSL corresponding to the embodiment shown in FIG. 1A. As shown in FIG. 1B, the column select line is activated based on the rising edge of the clock signal (CLK).

Figure 1C:
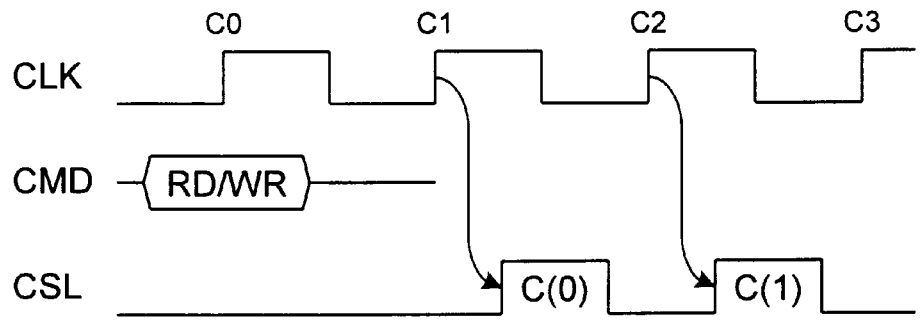

FIG. 1C shows another timing diagram of the CSL corresponding to the embodiment shown in FIG. 1A. As shown in FIG. 1C, the column select line is activated based on the rising edge of the clock signal (CLK) but one clock cycle after a memory access command (RD/WR) is received on a command line (CMD). This delay may be necessitated, for example, by the need to wait for the arrival of the input data.

Figure 2A:
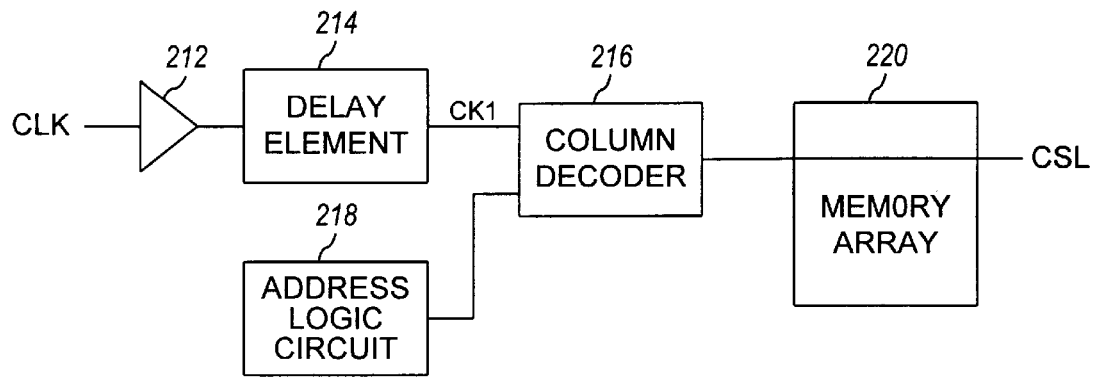
FIG. 2A shows a block diagram of an embodiment of another circuit that activates the column select line.

FIG. 2A shows a block diagram of an embodiment of another circuit that activates the column select line. The circuit in FIG. 2A is similar to that of FIG. 1A, with the addition of a delay element 214 interposed between a clock buffer 212 and a column decoder 216. As shown in FIG. 2A, the clock signal (CLK) is provided to a buffer 212 and further to delay element 214. Column decoder 216 receives the delayed clock signal (CK1) from delay element 214 and a memory address from an address logic circuit 218, and activates (or selects) a column select line in a memory array 220.

Figure 2B:
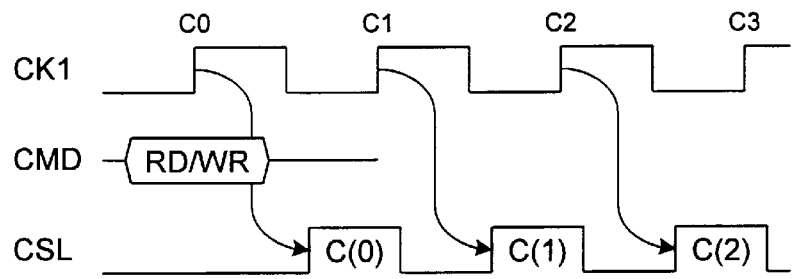
FIG. 2B shows a timing diagram of the CSLs corresponding to the embodiment shown in FIG. 2A.

FIG. 2B shows a timing diagram of the CSL corresponding to the embodiment shown in FIG. 2A. As shown in FIG. 2B, the column select line is activated based on the rising edge of the delayed clock signal (CK1) from delay element 214 and after a memory access command (RD/WR) is received on the command line (CMD).

The timing diagrams shown above can be applied to a single data rate (SDR) operation wherein one data bit is written to, or read from, the memory array per clock cycle. For SDR write operation, the write command and the data bit are generally provided to the memory device concurrently.

To increase the data transfer rate of a memory array, a double data rate (DDR) operation performs memory access of two data bits within one clock cycle. For a read operation, a "prefetch" of two data bits from two different addresses is performed. Similarly, for a write operation, two data bits are received and stored to the memory array within one clock cycle. For both read and write operations, the column select line can be activated after both data bits become available. Other conditions may also be applied (i.e., waiting for receipt of a memory access command) before the column select line is activated.

Figure 3:
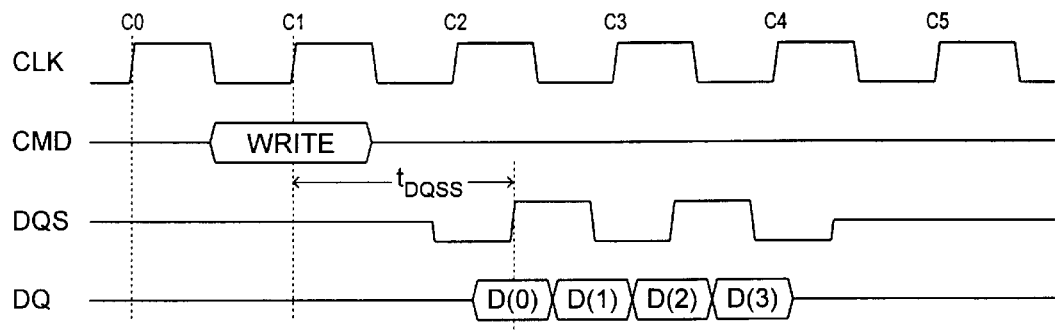
FIG. 3 shows a timing diagram for a double data rate (DDR) write operation in accordance with JEDEC specifications.

FIG. 3 shows a timing diagram for a DDR write operation in accordance with JEDEC specifications. JEDEC specifications are "open" standards that define the timing of the external control and data signals for DDR memory devices. The clock signal (CLK) is shown at the top of the diagram. A memory write command (WRITE) is received during the clock cycle (C1) on a command line (CMD). Data for the write operation is received on a data line (DQ) starting at approximately one clock cycle after the WRITE command is received. In accordance with JEDEC standards, a strobe control signal (which is also referred to as a DQ strobe input or a "DQS" signal) is provided during write operations to indicate when the input data is available. The DQS line is brought to logic low for a half cycle of the CLK signal before the arrival of the first data bit. This time period is referred to as a "write preamble" of the write operation. Each full rising and falling edge on the DQS line corresponds to an input data bit.

As shown in the timing diagram in FIG. 3, a delay of approximately one CLK clock cycle exists between the receipt of the WRITE command and the arrival of the first data bit D(0). This time delay is denoted as $t_{DQSS}$. In accordance with JEDEC specifications, $t_{DQSS}$ can vary from 0.75 $t_{CLK}$ (minimum) to 1.25 $t_{CLK}$ (maximum), where $t_{CLK}$ is the period of one cycle of the CLK signal. Furthermore, $t_{CLK}$ can vary from 5.0 nsec (minimum) to 12.0 nsec (maximum). FIG. 3 shows a burst of four data bits D(0) through D(3).

Figure 4:
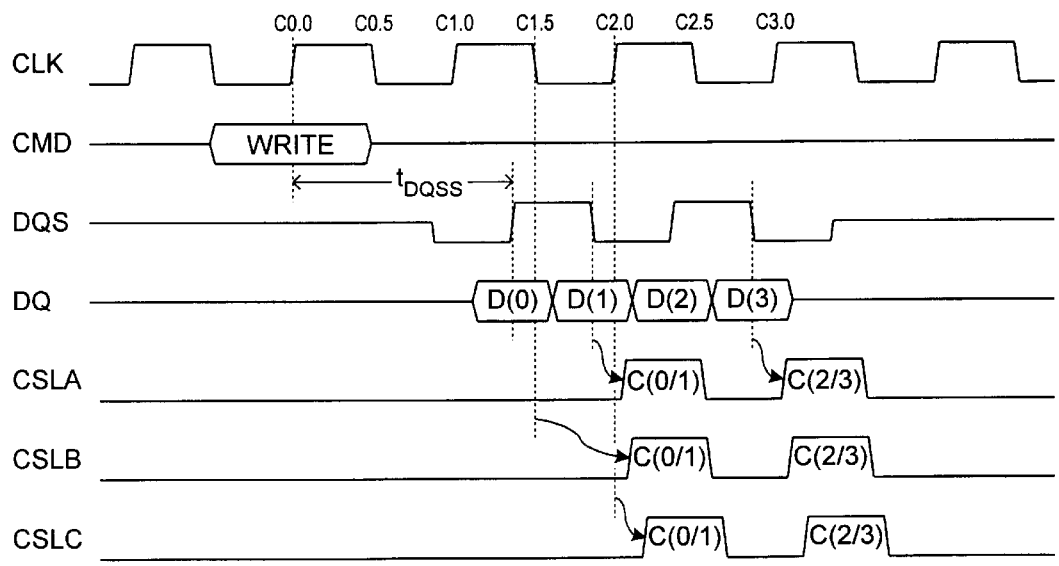
FIG. 4 shows a timing diagram of column select lines for a DDR write operation in accordance with various embodiments of the invention.

FIG. 4 shows a timing diagram of column select lines for a DDR write operation in accordance with various embodiments of the invention. The clock signal (CLK), command signal (CMD), data strobe signal (DQS), and data input signal (DQ) from FIG. 3 are replicated at the top portion of FIG. 4. For DDR write operations, the column select line can be activated in various manners, some of which are shown in FIG. 4.

In one embodiment, the column select line (CSLA) is activated based on the DQS signal. As shown in FIG. 4, the first rising edge of the DQS signal corresponds to the first data bit D(0) and the first full falling edge corresponds to the second data bit D(1). Typically, a DDR write operation is not performed until both data bits are received. Thus, to ensure proper write operations, the column select line is typically not triggered before both data bits are available. The first enable pulse C(0/1) on the column select line (CSLA) is generated based on the first full falling edge of the DQS signal, which corresponds to the second data bit D(1) of the input data bit pair. This enable pulse is used to perform a memory write of the first pair of data bits D(0) and D(1). Similarly, the second enable pulse C(2/3) on the column select line (CSLA) is generated based on the second full falling edge of the DQS signal and is used to perform a memory write of the second pair of data bits D(2) and D(3).

In another embodiment, the column select line (CSLB) is activated based on the falling edge of the CLK signal at one and a half clock cycles (e.g., C1.5) from the receipt of the WRITE command. This is shown by the first enable pulse C(0/1) on the column select line (CSLB) being derived from the C1.5 clock edge. As stated above, the delay ($t_{DQSS}$) from the WRITE command to the first data bit can be up to 1.25 $t_{CLK}$, and the second data bit D(1) may not arrived until 1.75 $t_{CLK}$ from the receipt (at C0.0) of the WRITE command. Thus, the enable pulses on the column select line (CSLB) is delayed by an additional (approximately) 0.25 $t_{CLK}$ from C1.5.

The 0.25 $t_{CLK}$ of additional delay can be provided by a delay element, such as delay element 214 in FIG. 2A. The delay element can be implemented with buffers, inverters, or other logic devices or elements. When designing for a worse case $t_{CLK}$ of 12.0 nsec, as specified by the JEDEC standards, a delay of approximately 3.0 nsec is provided by the delay element. This 3.0 nsec of delay is typically fixed (i.e., hardwired) and can be (relatively) long when the memory array is operated at a higher frequency. For example, if the memory array is operated with a $t_{CLK}$ of 6.0 nsec, the fixed delay of 3.0 nsec represents a half clock cycle of delay, or 0.5 $t_{CLK}$. This additional delay can be (relatively) long for some applications.

In yet another embodiment, the column select line (CSLC) is activated based on the rising edge of the CLK signal at two clock cycles (e.g., C2.0) from the receipt of the WRITE command. This is shown by the first enable pulse C(0/1) on the column select line (CSLC) being derived from the C2.0 clock edge. This embodiment can be an improvement over the column select line (CSLB) since no delay of the column select line is required.

Triggering (or activating or selecting) the column select line (CSLA) from the DQS signal can provide some advantages over triggering the column select lines (CSLB and CSLC) from the clock signal (CLK). By triggering the column select line earlier, more margins can be provided for the $t_{WR}$ specification for write operations, which can improve manufacturing yields of a memory device. The $t_{WR}$ specification defines the time period from a clock edge that register the last data bits for a write operation to a clock edge that register a precharge command. Furthermore, triggering the column select line earlier (e.g., with the DQS signal) provides more margins when transitioning from a write operation to a read operation. An earlier triggered column select line for a write operation results in a write enable pulse that is located further away (time-wise) from the first read enable pulse for the immediately following read operation.

In FIG. 4, the column select lines CSLA, CSLB, and CSLC are activated for a DDR write operation. The same column select lines can also be activated for a SDR write operation. Referring to FIGS. 1C and 2B, a DQS signal can be generated having a first rising edge (e.g., at C0) corresponding to the time the memory access command (RD/WR) is received. This DQS signal can then be used to activate a column select line similar to CSLA shown in FIG. 4. Similarly, a column select line similar to CSLB or CSLC can be activated in FIGS. 1C and 2B using the clock signal (CLK).

The above describes generation of the column select line for write operations. The column select line for read operations can also be activated based on the CLK signal or the DQS signal.

Figure 5:
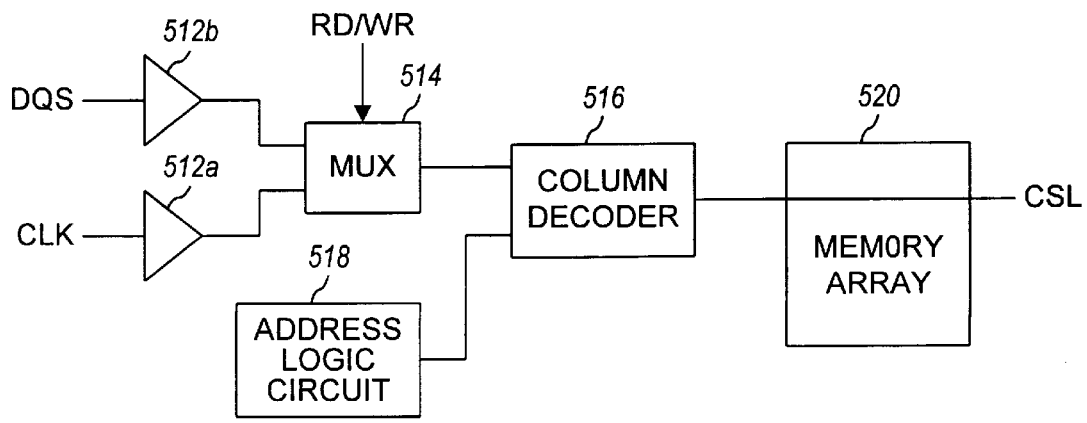
FIG. 5 shows a block diagram of an embodiment of a circuit that activates column select line for read and write operations.

FIG. 5 shows a block diagram of an embodiment of a circuit that activates the column select line for read and write operations. As shown in FIG. 5, the clock signal (CLK) is provided to a buffer 512a and further to an input of a multiplexer (MUX) 514. The data strobe signal (DQS) is provided to a buffer 512b and further to a second input of MUX 514. MUX 514 provides either the CLK signal or the DQS signal to a column decoder 516, depending on whether a write or read operation is being performed (e.g., as indicated by the control signal (RD/WR)), and depending on the embodiment used to generate the column select line. In one embodiment, during a write operation, the DQS signal is used to generate write enable pulses on the CSL, and during a read operation, the CLK signal is used to generate read enable pulses on the CSL. Column decoder 516 also receives a memory address from an address logic circuit 518 and activates (or selects) the column select line in a memory array 520.

Various aspects of the invention have been described in the context of a double data rate (DDR) memory device. However, the invention is generally applicable for single data rate and multi-data rate operations. For example, the invention can be used for a quadruple data rate operation.

The memory arrays described herein can be implemented within a stand-alone integrated circuit (IC) such as, for example, a DRAM IC. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A device comprising:
 a memory array configured to store data values;
 an address logic circuit configured to generate an address for the memory array; and
 a column decoder coupled to the address logic circuit and the memory array, the column decoder configured to receive at least one of a data strobe signal and a clock signal and to activate a column select line corresponding to the generated address for the memory array,
 wherein the column select line is activated based on either the data strobe signal or the clock signal depending on a particular operating mode of the memory array.

2. The device of claim 1, wherein the data strobe signal and the clock signal conform to JEDEC standards.

3. The device of claim 1, wherein the column select line is activated based on rising edges of the clock signal.

4. The device of claim 1, wherein the column select line is activated based on falling edges of the clock signal.

5. The device of claim 1, wherein the column select line is delayed by a particular time period.

6. The device of claim 1, wherein the memory device operates in multi-data rate.

7. The device of claim 1, wherein the memory device operates in double data rate (DDR).

8. A dynamic random access memory (DRAM) comprising the device of claim 1.

9. A synchronous graphics random access memory (SGRAM) comprising the device of claim 1.

10. An integrated circuit comprising an embedded memory array and the device of claim 1.

11. A device comprising:
 a memory array configured to store data values;
 an address logic circuit configured to generate an address for the memory array; and
 a column decoder coupled to the address logic circuit and the memory array, the column decoder configured to receive at least one of a data strobe signal and a clock signal and to activate a column select line for the memory array,
 wherein the column select line is triggered using the data strobe signal during write operations.

12. A device comprising:
a memory array configured to store data values;
an address logic circuit configured to generate an address for the memory array; and
a column decoder coupled to the address logic circuit and the memory array, the column decoder configured to receive at least one of a data strobe signal and a clock signal and to activate a column select line for the memory array,
wherein the column select line is triggered using the clock signal during read operations.

13. A device comprising:
a memory array configured to store data values;
an address logic circuit configured to generate an address for the memory array; and
a column decoder coupled to the address logic circuit and the memory array, the column decoder configured to receive at least one of a data strobe signal and a clock signal and to activate a column select line for the memory array,
wherein the column select line is activated based on falling edges of the data strobe signal.

14. A device comprising:
a memory array configured to store data values;
an address logic circuit configured to generate an address for the memory array; and
a column decoder coupled to the address logic circuit and the memory array, the column decoder configured to receive at least one of a data strobe signal and a clock signal and to activate a column select line for the memory array,
a multiplexer coupled to the column decoder, the multiplexer configured to receive the data strobe signal and the clock signal and to provide an output signal based on an operating mode of the device.

15. The device of claim 14, wherein the multiplexer provides the data strobe signal to the column decoder during a write operation and the clock signal during a read operation.

16. A dynamic random access memory (DRAM) comprising the device of claim 14.

17. The device of claim 14, wherein the memory device operates in multi-data rate.

18. A method for performing a write of data bits to memory cells within a memory array comprising:
receiving at least one of a data strobe signal and a clock signal;
receiving the data bits;
activating a column select line for the memory array based on either the data strobe signal or the clock signal depending on a particular operating mode of the memory device; and
writing the data bits to memory cells within the memory device identified, in part, by the column select line.

19. The method of claim 18, wherein the data strobe signal and the clock signal conform to JEDEC standard.

20. The method of claim 18, wherein the column select line is triggered based on falling edges of the data strobe signal.

21. The method of claim 18, wherein the column select line is triggered based on rising edges of the clock signal.

22. The method of claim 18, wherein the column select line is triggered based on falling edges of the clock signal.

23. The method of claim 18, wherein the column select line is delayed by a particular delay period.

24. The method of claim 18, wherein the memory array is operated in a multi-data rate.

25. The method of claim 18, wherein the memory array is operated in a double data rate (DDR).

26. The method of claim 18, wherein the column select line is activated based on a particular timing of the data bits.

27. A method for accessing a memory array comprising:
receiving at least one of a data strobe signal and a clock signal;
generating an address for the memory array;
activating a column select line corresponding to the generated address, wherein the column select line is activated based on either the data strobe signal or the clock signal depending on a particular operating mode of the memory device; and
performing a memory access of memory cells within the memory array identified, in part, by the activated column select line.

28. The method of claim 27, wherein the memory access is a read operation.

29. The method of claim 27, wherein the memory access is a write operation.

30. The method of claim 27, wherein the column select line is activated based on a particular timing of data bits to be written to the memory array during a write operation.

* * * * *